United States Patent [19]
Hino et al.

[11] Patent Number: 5,655,087
[45] Date of Patent: Aug. 5, 1997

[54] CAD SYSTEM CAPABLE OF CALCULATING COSTS DURING CAD OPERATION

[75] Inventors: Yukari Hino; Seiji Takeo, both of Tokyo, Japan

[73] Assignee: NEC Corporation, Tokyo, Japan

[21] Appl. No.: 465,574

[22] Filed: Jun. 5, 1995

Related U.S. Application Data

[63] Continuation of Ser. No. 245,115, May 17, 1994, abandoned.

[30] Foreign Application Priority Data

May 17, 1993 [JP] Japan ................... 5-136958

[51] Int. Cl.⁶ .................................................. G06F 17/60
[52] U.S. Cl. .................................. 395/229; 364/468.14
[58] Field of Search .................... 364/401 R, 474.24, 364/468.04, 468.14; 395/919, 923, 207, 208, 229

[56] References Cited

U.S. PATENT DOCUMENTS

| | | | |
|---|---|---|---|
| 4,630,219 | 12/1986 | DiGiacomo et al. | 364/488 |
| 4,862,376 | 8/1989 | Ferriter et al. | 364/468 |
| 4,875,162 | 10/1989 | Ferriter et al. | 364/401 |
| 4,964,060 | 10/1990 | Hartsog | 364/512 |
| 5,033,014 | 7/1991 | Carver et al. | 364/474.24 |
| 5,089,970 | 2/1992 | Lee et al. | 364/468 |
| 5,109,337 | 4/1992 | Ferriter et al. | 364/401 |
| 5,111,392 | 5/1992 | Malin | 364/401 R |
| 5,201,046 | 4/1993 | Goldberg et al. | 395/600 |
| 5,249,120 | 9/1993 | Foley | 364/401 |
| 5,255,207 | 10/1993 | Cornwell | 364/401 |
| 5,293,479 | 3/1994 | Quintero et al. | 395/161 |
| 5,307,261 | 4/1994 | Maki et al. | 364/401 |
| 5,307,282 | 4/1994 | Conradson et al. | 364/468 |
| 5,343,401 | 8/1994 | Goldberg et al. | 364/470 |

*Primary Examiner*—Donald E. McElheny, Jr.
*Attorney, Agent, or Firm*—Foley & Lardner

[57] ABSTRACT

In a computer aided design system used in manufacturing metal parts in accordance with a computer aided design program, a cost calculation program is included in the computer aided design program. The cost calculation program comprises steps of calculating processing, material, plating, painting, and total costs and can be accessed by a user during a design from time to time to know each cost.

14 Claims, 4 Drawing Sheets

| | | | | | |
|---|---|---|---|---|---|
| SPECIES OF MATERIAL | 1. ALUMINUM | | | | 1. ALUMINUM<br>2. IRON<br>3.<br>4.<br>5. STAINLESS |
| DESIRED AREA | X 100 | | | | |
| | Y 150 ■ | | | | |

MATERIAL COST CALCULATION PARAMETERS

FIG. 5

FIGURE NUMBER : 123-A00111-01 (MONETARY UNIT : YEN)

| | LOT~3 | ~9 | ~99 | ~299 | ~999 |
|---|---|---|---|---|---|
| PROCESSING COST | 1605 | 545 | 270 | 160 | 130 |
| MATERIAL COST | 75 | 75 | 75 | 75 | 75 |
| PLATING COST | 270 | 100 | 45 | 30 | 25 |
| PAINTING COST | 0 | 0 | 0 | 0 | 0 |
| TOTAL COST | 1950 | 720 | 390 | 265 | 230 |

FIG. 6

CAD SYSTEM CAPABLE OF CALCULATING COSTS DURING CAD OPERATION

This application is a continuation of application Ser. No. 08/245,115, filed May 17, 1994, now abandoned.

BACKGROUND OF THE INVENTION

This invention relates to a computer aided design (CAD) system and, in particular, a computer aided design system (CAD) for use in manufacturing metal parts by processing a metal plate.

Conventionally, a wide variety of CAD systems have been proposed so as to design or draw various hardware products. Metal parts may be included in the products. At any rate, each of the conventional CAD systems is operated in accordance with a program which is prepared for each product and which may be called a CAD program.

On the other hand, disclosure is made by Ferriter et al in U.S. Pat. No. 4,875,162 as regards a method for automatic interfacing of a conceptual tool and a project management tool. Specifically, the method is carried out by using a system which implements a top-down functional approach to hardware product design and then automatically inputs the information gathered from the user to the project management tool by the use of the conceptual design tool. This system enables cost estimates at very early development phase of the product. As a result, such cost estimates serve to determine product feasibility. To this end, a relational database table is used to form a bill of material. The system might be suitable for manufacturing a lawnmower or the like, as exemplified in the referenced patent.

From this fact, it is readily understood that the method is effective to form a bill or list of materials, parts, and the like and serves as the automatic interfacing of the conceptual tool and the project management tool.

However, the method is not related to a CAD program. In addition, no consideration is directed to the CAD system which is for use in designing the metal parts which are manufactured through a processing step, a material selection step, a plating step, and a painting step.

Herein, it is to be noted that costs are varied at practically every step of manufacturing each of the metal parts because each of the metal parts is manufactured through the above-mentioned steps. In this connection, a cost of plating (plating cost) and a cost of painting (painting cost) should be successively summed up together with a processing cost and a material cost to calculate a total cost in metal plate processing.

Under the circumstances, cost estimates are practically made after a design of each of the metal parts is completed or finished by an engineer. Accordingly, when the cost estimates exceed an estimated cost, it is difficult to redesign each of the metal parts so as to reduce a cost.

SUMMARY OF THE INVENTION

It is an object of this invention to provide a CAD system which is capable of estimating a cost at every step while a metal plate is processed.

It is another object of this invention to provide a CAD system of the type described, which can readily cope with redesigning each of metal parts and which can contribute to a reduction of a cost.

It is still another object of this invention to provide a CAD system of the type described, which can readily and simply estimate a cost by a designer who is watching a picture on a display unit.

A computer aided design system to which this invention is applicable is for use in designing parts composed of a plurality of figure elements. According to an aspect of this invention, the system comprises input means for inputting a figure information signal related to the figure elements, cost calculating means supplied with the figure information signal for calculating a cost associated with each of the parts on the basis of the figure information signal; and output means coupled to the cost calculating means for outputting the cost.

According to another aspect of this invention, a method is provided for designing parts in accordance with a computer aided design program. Each of the parts is composed of a plurality of figure elements. The method comprises the steps of producing a figure information signal associated with the figure elements and calculating a cost of each of the parts on the basis of the figure information signal.

BRIEF DESCRIPTION OF THE DRAWING

FIG. 5 exemplifies an input image used in the CAD system to input cost parameters; and FIG. 6 also exemplifies a cost display image used in the CAD system to display results of cost calculations.

DESCRIPTION OF THE PREFERRED EMBODIMENT

Figure 1:
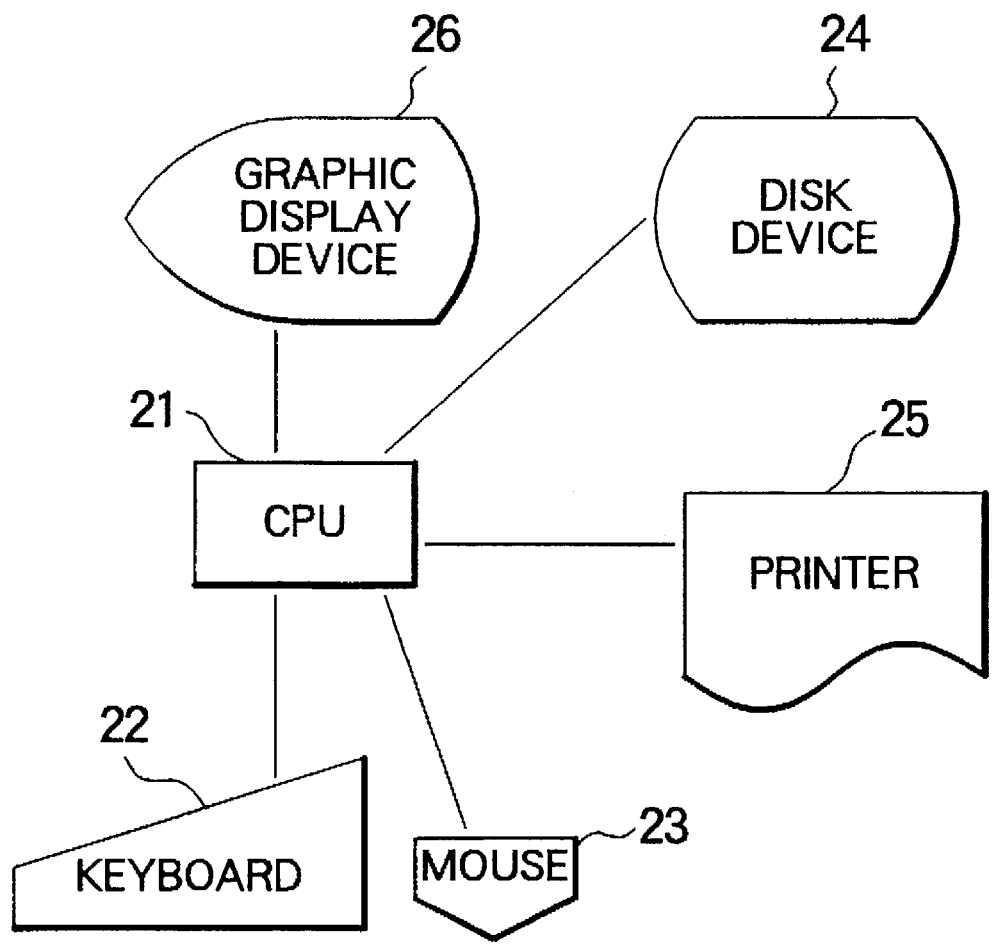
FIG. 1 is a block diagram of a computer aided design (CAD) system according to a preferred embodiment of this invention.

Referring to FIG. 1, a computer aided design (CAD) system according to a preferred embodiment of this invention is for use in designing metal parts manufactured by processing or working a metal plate. Such metal parts may be used, for example, for a rack used in a communication device or the like. The illustrated CAD system comprises a central processing unit (CPU) 21, a key board 22 and a mouse 23 both of which are operable to input an input information signal necessary for designing each of the metal parts and which may be collectively called as an input device. In the CAD system, a disk device 24 memorizes various information signals (will be described later in detail) in cooperation with the CPU 21 and will be referred to as a memory device.

In addition, a printer 25 and a graphic display device 26 are connected to the CPU 21 and are collectively operable as an output device. The illustrated CAD system is substantially similar in hardware structure to a conventional CAD system but is operable in a manner which is different from that of the conventional CAD system, as will become clear as the description proceeds. In this connection, the CAD system illustrated in FIG. 1 performs usual CAD functions like in the conventional CAD system to process the metal plate and a specific function in a manner to be described later in detail. Such a processing operation may include a punching process, a tap mounting process, and the like.

In the example being illustrated, the specific function is performed to calculate costs necessary for designing the metal parts. Herein, it is to be noted that the specific function can be executed during a design by the use of the illustrated CAD system. At any rate, such usual CAD and specific functions are executed in accordance with a CAD software program. In other words, the CAD software program includes a usual CAD program for executing the usual CAD functions and a specific program for executing the specific function. This means that the specific program is united with the usual CAD program.

Figure 2:
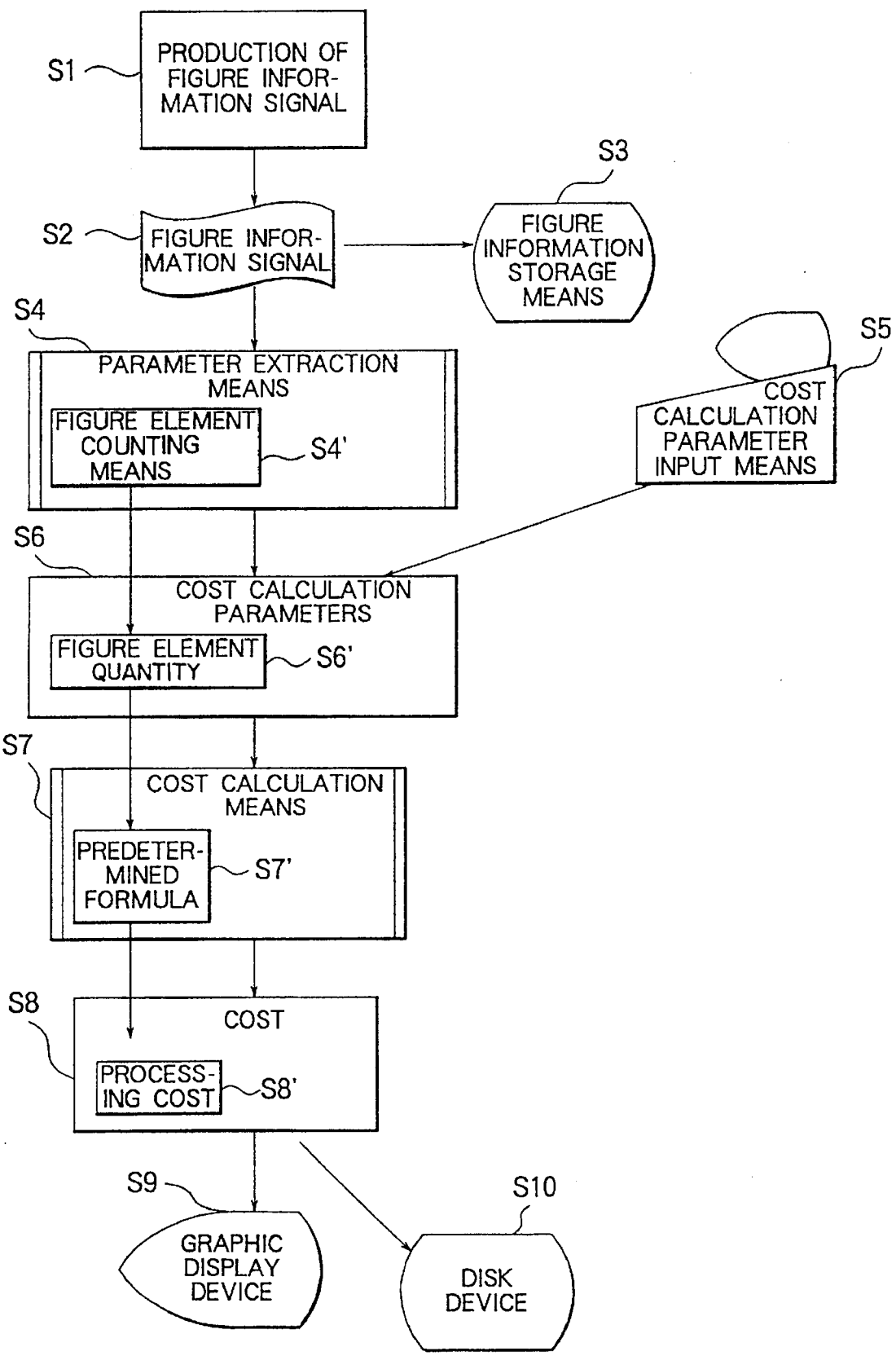
FIG. 2 is a flow chart for use in describing operation of the CAD system illustrated in FIG. 1.

Referring to FIG. 2 together with FIG. 1, the CAD system illustrated in FIG. 1 is operated in accordance with a flow chart of FIG. 2 to draw a figure on the graphic display device 26 by the use of the input device, such as the key board 22 and the mouse 23. At any rate, a figure information signal is produced in the CAD system in accordance with the usual CAD program by the use of the input device, as shown at a step S1, and inputted into the CPU 21 (FIG. 1). This shows that a user inputs the figure information signal at the step S1 by manipulating the input device. In this connection, the CAD system (FIG. 1) except for the printer 25 and the disk device 24 serves to produce the figure information signal and may be referred to as figure information production means.

Thus, the figure information signal is obtained by the usual CAD functions, as shown at a step S2, and may be memorized into the disk device 24 (FIG. 1). Therefore, the disk device 24 may be referred to as a figure information storage unit or means, as labeled in a block (S3) in FIG. 2.

In the illustrated example, the specific function is performed to calculate the costs which are composed of a processing cost, a material cost, a plating cost, a painting cost, and a total cost when the metal parts are manufactured by the illustrated CAD system. Various kinds of parameters are necessary so as to calculate the above costs and are classified into primary (or predetermined) and subsidiary (or selectable) cost calculation parameters which will simply be called primary and subsidiary parameters, respectively. Herein, the primary parameters can be automatically extracted from the figure information signals by the usual CAD functions while the subsidiary parameters can not be extracted from the figure information signals. Moreover, the quantity of figure elements is automatically counted by the CAD software program to provide a figure element quantity.

When extraction of the primary parameters is indicated by the user so as to carry out cost calculation, a first predetermined subroutine of the CAD software program is energized to automatically extract the primary parameters from the figure information signal by the CAD software program, as depicted at a step S4. The primary parameters may include the number of holes, the number of taps drawn on the input figure. In addition, the number of figure elements are also counted by the CAD software program, as depicted at a block S4' located within the block (S4), to be produced as a specific parameter, namely, the figure element quantity. In this connection, the first predetermined subroutine serves to extract the primary parameters and the specific parameter from the figure information signal also and may be called parameter extraction means (S4).

The subsidiary parameters are inputted from the input device into the CPU 21 by the user to calculate the cost or costs, as depicted at a step S5 in FIG. 2 because such subsidiary parameters should be directly indicated by interactively the user. In other words, the user inputs the subsidiary parameters into the CPU 21 by selecting a pertinent one of items displayed and prompted on the graphic display device 26 (FIG. 1) in a manner to be described.

Thus, the primary and the subsidiary parameters are delivered to the CPU 21 and memorized into a memory of the CPU 21, as depicted at a step S6. Likewise, the specific parameter, the figure element quantity, is also memorized in the memory of the CPU 21, as indicated by a block (S6') labeled "figure element quantity" within the block (S6).

Under the circumstances, a second predetermined subroutine of the CAD software program is energized to execute the specific function, namely, the cost calculation operation, as shown at a step S7. In the illustrated example, the processing cost is calculated, as shown at a step S7' in the block (S7) on the basis of a predetermined formula which specifies a correlation between the figure element quantity and the processing cost. The predetermined formula will be described later in detail.

Likewise, the material, the plating, and the painting costs are also individually calculated in accordance with formulae determined for the respective costs in the second predetermined subroutine. Thus, the processing, the material, the plating, and the painting costs are obtained at the step S7 by inserting the primary and the subsidiary parameters. This means that the formulae are executed in accordance with the second predetermined subroutine to calculate the above-mentioned costs. In this connection, the second predetermined subroutine may be referred to as cost calculation means for individually calculating the processing, the material, the plating, and the painting costs.

It is to be noted that the total cost is given by a sum of the processing, the material, the plating, and the painting costs. Taking this into account, the total cost is calculated at a step S8 in consideration of the processing cost obtained from the predetermined formula. Specifically, the sum of the processing, the material, the plating, and the painting costs is calculated at the step S8.

The total cost is displayed on the graphic display device 26, as shown at a step S9, on one hand and is memorized into the disk memory 24, as shown at a step S10, on the other hand.

As mentioned before, the processing cost can be simply obtained by inserting the figure element quantity into the predetermined formula.

Figure 3:
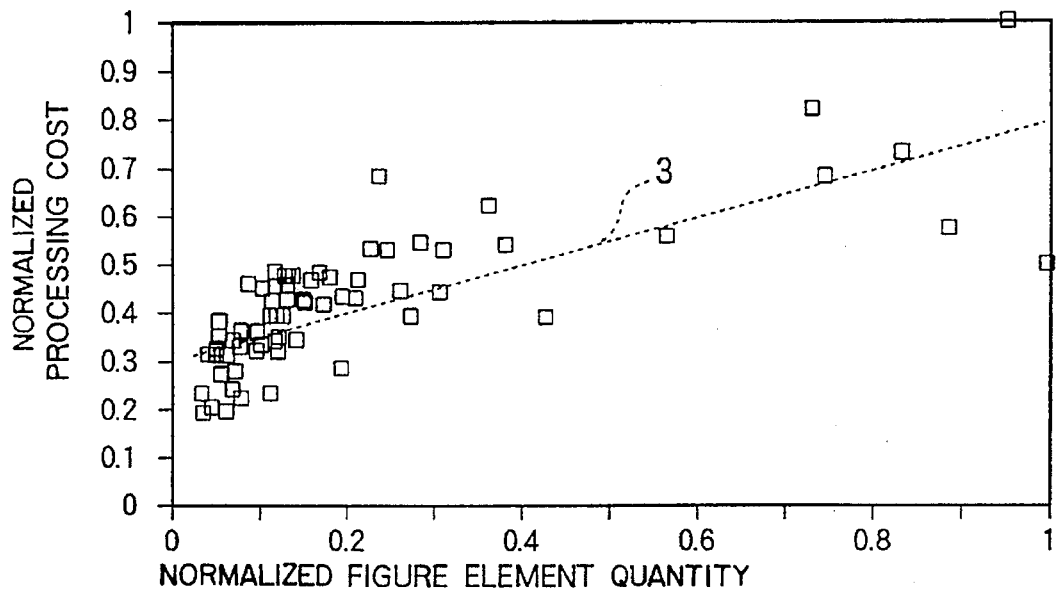
FIG. 3 is a graphical representation for illustrating a correlation between a quantity of figure elements and a processing cost.

Referring to FIG. 3, wherein an abscissa and an ordinate represent a normalized figure element quantity and a normalized processing cost, respectively, correlations between the normalized figure element quantity and the normalized processing cost are depicted at white squares. The correlations mentioned above can be approximated by a dotted line curve 3 which can be represented by the predetermined formula. As is apparent from the curve 3, the processing cost is increased with an increase of the figure element quantity. Stated otherwise, the processing cost is substantially proportional to the figure element quantity in the illustrated example.

Thus, the processing cost can be automatically attained by inserting the figure element quantity into the predetermined formula, if the figure element quantity is given. At any rate, the correlation specified by the curve 3 is programmed and included in the CAD software program.

Inasmuch as the predetermined formula would be changed in each CAD system in question, it is necessary to individually determine the predetermined formula in each system. As mentioned above, the processing cost can be simply and automatically calculated from the figure element quantity in accordance with the predetermined formula defined in each CAD system in correspondence to the metal parts.

Figure 4:
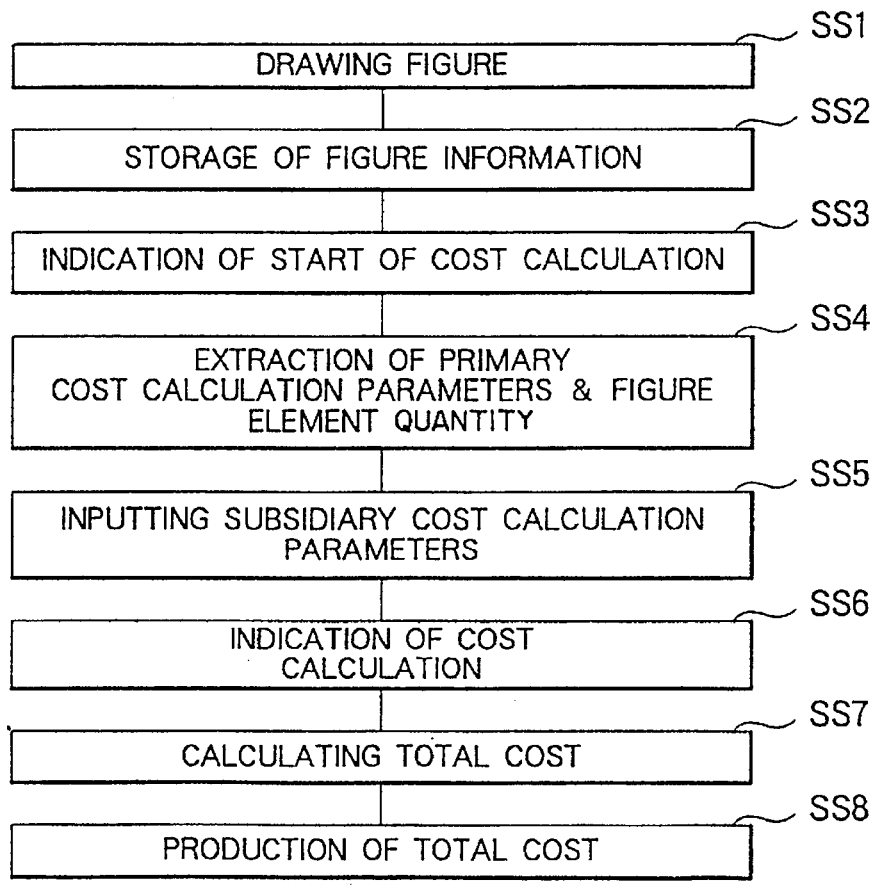
FIG. 4 is another flow chart for use in describing the operation of the CAD system more in detail.

Referring to FIG. 4, the cost calculation operation will be described more in detail. At a first stage SS1, a figure is drawn by a user on the graphic display device 26 by means of the input device to produce an image or figure information signal representative of the figure. In this event, the usual CAD functions are operated to draw the figure. Thereafter, the figure information signal is memorized or stored into the disk device 24 at a second stage SS2.

After storage of the figure information signal, the user indicates a start of cost calculation by the use of the input device at a third stage SS3.

When the start of the cost calculation is indicated by the user, software is operated to execute the operation as illustrated with reference to FIG. 2 and to finally calculate the total cost for the metal parts. More specifically, the primary cost calculation parameters are automatically extracted at a fourth stage SS4 together with the figure element quantity from the figure information signal. The primary cost calculation parameters are specified by parameters necessary for calculation of the material cost, the plating cost, and the painting cost. In addition, the subsidiary cost calculation parameters are input by the user from the input device into the CPU 21 at a fifth stage SS5. Subsequently, cost calculation is indicated by the user at a sixth stage SS6 and executed at a seventh stage SS7 to attain the total cost. The total cost is produced at an eighth stage SS8 as a result of the cost calculation. In this case, the total cost is displayed on the graphic display device 26 on one hand and is memorized in the disk device 24 on the other hand.

Referring to FIG. 5, an input image is exemplified on the graphic display device 26 to calculate the material cost. On the graphic display device 26, a user selects the subsidiary cost calculation parameters which are necessary for calculating the material cost. In the example being illustrated, a species of a material has been already determined by the user by selecting aluminum on the graphic display device 26 and an input operation of a desired area is being prompted on the graphic display device 21 by a cursor specified by a black square. In this case, an information signal which is obtained by the usual CAD functions may be displayed on the graphic display device 21.

Similar input images are displayed on the graphic display device 21 on inputting the subsidiary cost calculation parameters necessary for the plating cost and the painting cost. Input operations are prompted on the graphic display device 21 until all of the subsidiary cost calculation parameters are completely inputted.

Referring to FIG. 6, the processing, the material, the plating, the painting, and the total costs are displayed in the form of a cost image and arranged along a column direction. Along a row direction, a relationship between lot numbers and each cost is shown on the cost image.

According to this invention, the cost calculation software is included as the cost calculation means in a CAD program, as mentioned with reference to FIG. 2. With this structure, it is possible to know the total cost during a design by referring to CAD information signals related to a figure which is being designed. This means that redesigning is readily possible when each of the processing, the material, the plating, the painting, and the total costs exceeds each of budget costs determined for each of the above-mentioned costs. As a result, it is possible to reduce the total cost of each of the metal parts.

While this invention has thus far been described in conjunction with a preferred embodiment thereof, it will readily be possible for those skilled in the art to put this invention into practice in various other manners. For example, the processing cost may be calculated without utilizing the correlation between the figure element quantity and the processing cost. In addition, the CAD system according to this invention may not be always restricted to processing of the metal parts but may be applicable to an assembly including the parts.

What is claimed is:

1. A computer aided design system for use in designing an item comprising one or more parts, each of the parts being assembled within the computer aided design system by the drawing of a plurality of figure elements, said system comprising:

input means for inputting figure information signals related to the figure elements of each part, and for inputting selections of selectable parameters associated with at least one of the parts;

cost calculating means for calculating, on the basis of the figure information signals and the selected parameters, manufacturing costs necessary for manufacturing each of said parts; and a display unit coupled to said cost calculating means for displaying said manufacturing costs in the form of a table, wherein the input means receives instructions from a design engineer such that the design engineer can design the item on the computer aided design system by analyzing the costs associated with alternative parts and alternative figure elements for each part to minimize a total manufacturing cost of the item, and wherein said manufacturing costs include figure element-related processing costs for each of said plurality of figure elements and an additional quantity-related processing cost, different from the figure element-related processing costs, which is correlated with a quantity of figure elements in the item.

2. A computer aided design system as claimed in claim 1, each of said parts being manufactured through processing a plate of a metal material, including plating each of said parts, and painting each of said parts, wherein said cost calculating means comprises:

quantity-related processing cost calculating means supplied with said figure information signals including the quantity of figure elements for calculating the quantity-related processing cost;

material cost calculating means for calculating a material cost of said metal material;

plating cost calculating means for calculating a plating cost;

painting cost calculating means for calculating a painting cost; and total cost calculating means for summing up said quantity-related processing, said material, said plating, and said painting costs to produce a total cost, and wherein said displaying unit displays, in the form of said table, said quantity-related processing, material, plating, painting, and total costs.

3. A computer aided design system as claimed in claim 2, wherein:

said quantity-related processing cost calculating means is operable in accordance with an algorithm which is determined by a correlation between said quantity-related processing cost and the quantity of figure elements.

4. A computer aided design system as claimed in claim 3, wherein said quantity-related processing cost calculating means further comprises:

counting means supplied with said figure information signals for successively counting the number of the figure elements to produce the quantity of figure elements; and calculation means for calculating the quantity-related processing cost on the basis of said algorithm and the quantity of figure elements.

5. A computer aided design system as claimed in claim 2, wherein each of said material cost calculating means, said plating cost calculating means, and said painting cost calculating means comprises:

automatically extracting means for extracting, from said figure information signals, primary parameters necessary for calculating each of said material cost, said plating cost, and the painting cost;

means for inputting, through said input means, subsidiary parameters which are different from said primary parameters; and calculating means for calculating each of said material cost, said plating cost, and said painting cost in accordance with formulae predetermined for said material cost, said plating cost, and said painting cost by inserting said primary and said subsidiary parameters into said predetermined formulae.

6. A method of designing an item comprising one or more parts by using a display unit in accordance with a computer aided design program, each of said parts comprising, during the design process, a plurality of figure elements, said method comprising the steps of:

producing figure information signals associated with said plurality of figure elements for each part;

calculating, on the basis of said figure information signals and selected ones of selectable parameters, manufacturing costs necessary for manufacturing each of said parts, wherein said manufacturing costs include figure element-related processing costs for each of said plurality of figure elements and an additional quantity-related processing cost, different from the figure element-related processing costs, which is correlated with a quantity of figure elements in the item;

displaying said manufacturing costs in the form of a table on said display unit; and interactively designing the item on the computer aided design system in response to operator input and cost analysis associated with alternative parts and alternative figure elements for each part to minimize a total manufacturing cost of the item.

7. A method of designing a part by using a display unit in accordance with a computer aided design program, said part comprising a plurality of elements which are drawn as figure elements, said method comprising the steps of:

producing a figure information signal associated with said figure elements;

calculating, on the basis of said figure information signal, manufacturing costs necessary for manufacturing said part by counting the number of the figure elements from said figure information signal, and calculating a quantity-related processing cost of processing said part on the basis of a correlation between said quantity-related processing cost and the number of the figure elements counted; and displaying said manufacturing costs in the form of a table on said display unit.

8. A method as claimed in claim 7, wherein said manufacturing costs include a material cost of metal material, a plating cost of plating said part, and a painting cost of painting said part, wherein said calculating step further comprises the steps of:

individually calculating said material, said plating, and said painting costs; and summing up said quantity-related processing cost together with said material, said plating, and said painting costs to obtain said manufacturing costs.

9. A method as recited in claim 7, wherein said correlation between the number of figure elements counted and the quantity-related processing cost is determined in accordance with a pre-determined formula.

10. A method as recited in claim 9, wherein said pre-determined formula corresponds to a curve which correlates the quantity-related processing cost with the number of figure elements counted.

11. A method of designing an item comprising one or more parts on a computer aided design system comprising a display device, an input device, a storage device, and a CPU, the method comprising the steps of:

drawing, on the display device, under control of the CPU, a figure representative of a part of the item, in response to operator input via the input device, said figure including a plurality of figure elements;

producing a figure information signal corresponding to the drawn part;

storing the figure information signal in the storage device;

identifying predetermined parameters associated with the part;

displaying options on the display device related to selectable parameters associated with the part;

selecting certain selectable parameters from the selectable parameters displayed on the display device in response to operator input via the input device;

calculating costs associated with the predetermined parameters and the selected parameters in the CPU, wherein the calculated costs include figure element-related processing costs for each of said plurality of figure elements and an additional quantity-related processing cost, different from the figure element-related processing costs, which is correlated with a quantity of figure elements in the item; and displaying the calculated costs on the display device.

12. A method as recited in claim 11, further comprising the steps of:

repeating the selecting step to select a set of different selectable parameters;

calculating different costs associated with the predetermined parameters and the set of different selectable parameters; and displaying the different costs on the display device.

13. A method as recited in claim 11, further comprising the steps of:

repeating the drawing step to draw an alternative part in response to operator input, said alternative part including a plurality of alternative figure elements;

producing an alternative figure information signal corresponding to the alternative part;

storing the alternative figure information signal in the storage device;

identifying predetermined parameters associated with the alternative part based on the alternative figure information signal;

displaying options on the display device related to selectable parameters associated with the alternative part;

selecting certain selectable parameters from the selectable parameters associated with the alternative part displayed on the display device in response to operator input via the input device;

calculating alternative costs based on the predetermined parameters associated with the alternative part and the parameters selected from the selectable parameters associated with the alternative part in the CPU, wherein said calculated alternative costs include an alternative quantity-related processing cost; and displaying the calculated alternative costs on the display device.

14. A method as recited in claim 11, wherein the step of calculating costs further comprises the steps of:

counting the plurality of figure elements associated with said part to calculate the quantity of figure elements; and determining the quantity-related processing cost based on a programmed correlation between the quantity of figure elements and the quantity-related processing cost in accordance with a predetermined formula.

* * * * *